(12) United States Patent
Leibiger

(10) Patent No.: US 6,700,474 B1
(45) Date of Patent: Mar. 2, 2004

(54) HIGH VALUE POLYSILICON RESISTOR

(75) Inventor: Steven M. Leibiger, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/225,636

(22) Filed: Aug. 22, 2002

Related U.S. Application Data
(60) Provisional application No. 60/342,059, filed on Dec. 18, 2001, and provisional application No. 60/314,961, filed on Aug. 24, 2001.

(51) Int. Cl.[7] .............................................. H01C 1/012
(52) U.S. Cl. ...................... 338/309; 257/538; 438/210; 438/330
(58) Field of Search .................... 338/309; 257/536, 257/538; 438/210, 329, 330

(56) References Cited

U.S. PATENT DOCUMENTS

| 4,528,582 | A | * | 7/1985 | Cohen et al. | 257/538 |
| 4,785,342 | A | * | 11/1988 | Yamanaka et al. | 257/379 |
| 5,793,097 | A | * | 8/1998 | Shimamoto et al. | 257/538 |
| 5,959,343 | A | * | 9/1999 | Harada et al. | 257/528 |
| 6,054,359 | A | | 4/2000 | Tsui et al. | |
| 6,211,031 | B1 | | 4/2001 | Lin et al. | |

* cited by examiner

Primary Examiner—Karl D. Easthom
(74) Attorney, Agent, or Firm—Cesari and McKenna, LLP; Edwin H. Paul, Esq.

(57) ABSTRACT

A resistor structure is disclosed that is constructed out of two layers of polysilicon. The intrinsic device is made using the top layer which is either a dedicated deposition, or formed as part of an existing process step such as a base epi growth in a BiCMOS flow. This poly layer can be made with a relatively high (greater than 2000 ohms per square) sheet resistance by appropriate scaling of the implant dose or by insitu doping methods. The resistor ends are formed by the addition of a bottom poly layer in a self aligned manner with a deposition which may already be part of the process sequence. The end result is that the intrinsic resistor body is formed of a single poly layer, while the ends are created out of two layers. These ends are thick enough so that standard silicide and contact etch processing may be added to the structure without special care. In addition, dedicated or already available implants may be incorporated into the resistor ends to ensure ohmic contacts from polysilicon to the silicide or the contact metal are achieved. These steps can produce an easily fabricated resistor structure with consistent, low resistance, ohmic end contacts, and intrinsic resistance of greater than 2000 ohms per square.

17 Claims, 7 Drawing Sheets

HIGH VALUE POLYSILICON RESISTOR

CROSS-REFERENCE TO RELATED APPLICATIONS

The present application claims the benefit of U.S. Provisional Patent Application Serial No. 60/314,961, which was filed on Aug. 24, 2001, by the same inventor and entitled "High Value Split Poly Resistor" and Provisional Patent Application Serial No. 60/342,059 which was filed on Dec. 18, 2001, by the same inventor and entitled, "High Value Base Poly P-Resistor," both of these provisional patent applications are hereby, incorporated herein by reference.

BACKGROUND OF THE INVENTION

1. Field of the Invention

The present invention relates to a structure and process for forming polysilicon resistors on semiconductor substrates, and more particularly to dual layer polysilicon high value resistor structures.

2. Background Information

Forming high value polysilicon resistors on the same wafer together with other circuit components can be difficult. One reason is that the thickness of the polysilicon layer or layers is determined by the required characteristics of the other devices. For example, the deposited polysilicon must also form the gates and/or emitters of active components, lower value resistors and capacitor plates. This requires thicknesses that are typically greater than 200 nanometers (nm).

Polysilicon resistivity is a non-linear function of doping where the resistivity decreases quickly as the doping dose increases. Implant dose control makes resistivity greater than about 0.060 ohm-cm difficult to achieve. Since the resistance is a function of the resistivity divided by the thickness, practical sheet resistances are limited to not much above 2000 ohms/square. Therefore, meg-ohm resistors will consume much space and will greatly increase die size.

Attempts to form high value polysilicon resistors have used ion implants and reduced polysilicon thicknesses with limited success. Other structures have used multiple layers of polysilicon. But, these often require many additional steps and processes beyond those needed for the core devices on the same wafer, and the resulting resistors have device and process control limitations.

One such attempt is described in U.S. Pat. No. 6,211,031 to Dah-Chih Lin et al. This invention describes a split or dual value polysilicon process using two layers. A first layer is deposited and patterned to expose the underlying dielectric substrate. A second polysilicon layer is deposited over the first layer and the dielectric. Dual parallel resistors are formed. If the polysilicon resistivity is too high, the resistor end contact structures will form rectifying contacts. There is no suggestion or disclosure of processing to provide low ohmic end structures. The process of etching a contact hole that terminates on but does not go through the thin poly layer is also difficult.

Another approach is found in U.S. Pat. No. 6,054,359 to Yu-Ming Tsui et al. This patent describes a thin polysilicon layer with a thicker polysilicon layer overlaying the thinner layer. The thin layer is doped in place and the thicker layer is undoped. The combination of the two layers forms the resistor. This particular invention suffers especially from the undoped layer forming part of the end structures of the resistors being formed. The result is a relatively high ohmic end contacts for the resistors.

Prior art does not address the technical problems of integrating silicide or metal contacts into thin polysilicon resistors. In the case of silicide, the forming reaction will consume much if not all of a thin poly layer. For contact etch, the required overetch can completely burrow through the poly. Each of these can make the resistor non-functional or unreliable. For these reasons, prior art techniques often are forced to accept high impedance end structures or even non-ohmic connections.

Therefore, a need remains to provide high value polysilicon integrated circuit resistors having existing process compatibility; with few, if any, added process steps; and with a well controlled of the resistor end structures having relatively low ohmic resistances to the metalization layer.

SUMMARY OF THE INVENTION

An objective of the present invention is the creation of a high value polysilicon resistor that is easily integrated into an existing CMOS, bipolar, or BiCMOS process flow. This can be done either with no additional process complexity, or by the addition of a small number of dedicated processing steps, depending on the core flow being used.

A second objective of the invention is construction of the high value resistor out of two separately deposited polysilicon layers in such a way that the intrinsic resistor is formed from only one layer, while the resistor ends are formed from two self-aligned stacked layers. This allows the intrinsic resistor to be thinner and more lightly doped to achieve a high sheet resistance value (greater than 2000 ohms per square), while the end polysilicon stack can be thick enough to easily withstand normal processing such as contact etch, silicide formation, or other existing steps. The ends can also be implanted or otherwise doped heavier than the resistor body so that ohmic connections between the poly and the silicide or contact material can be achieved.

A third objective of the invention is formation of the resistor body with the second of the two polysilicon depositions and the formation of the resistor ends with both the first and second polysilicon depositions. This scheme of using the second polysilicon deposition to form the resistor body allows the resistor to be added to an existing process flow with little or in some cases no additional processing.

The above objectives are addressed in the present invention that provides two layers of polysilicon using a split poly approach. The intrinsic resistor is formed out of only one, thin, layer that can be constructed with a relatively high (greater than 2000 ohms per square) sheet resistance by appropriate scaling of the implant or by insitu doping methods. This layer may be a new, dedicated process step, or may be part of an existing processing sequence such as the non-selective epi (silicon or SiGe) and poly deposition in an epi base BiCMOS flow. The resistor ends, however, are comprised of two layers of polysilicon. The top layer is the intrinsic resistor layer, while the bottom layer is added for the resistor ends, and self-aligned to the first layer during a poly etching step. These ends are thick enough so that standard silicide and contact etch processing may be added to the structure without special precaution. The bottom resistor end layer is typically a polysilicon layer already in the process flow. In addition, already available implants may be incorporated into the resistor ends to ensure ohmic contacts are achieved. These steps can provide consistent, low resistance, ohmic end contacts with sufficient thickness for the required contact overetch.

It will be appreciated by those skilled in the art that although the following detailed description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

DETAILED DESCRIPTION OF AN ILLUSTRATIVE EMBODIMENT

Figure 1:
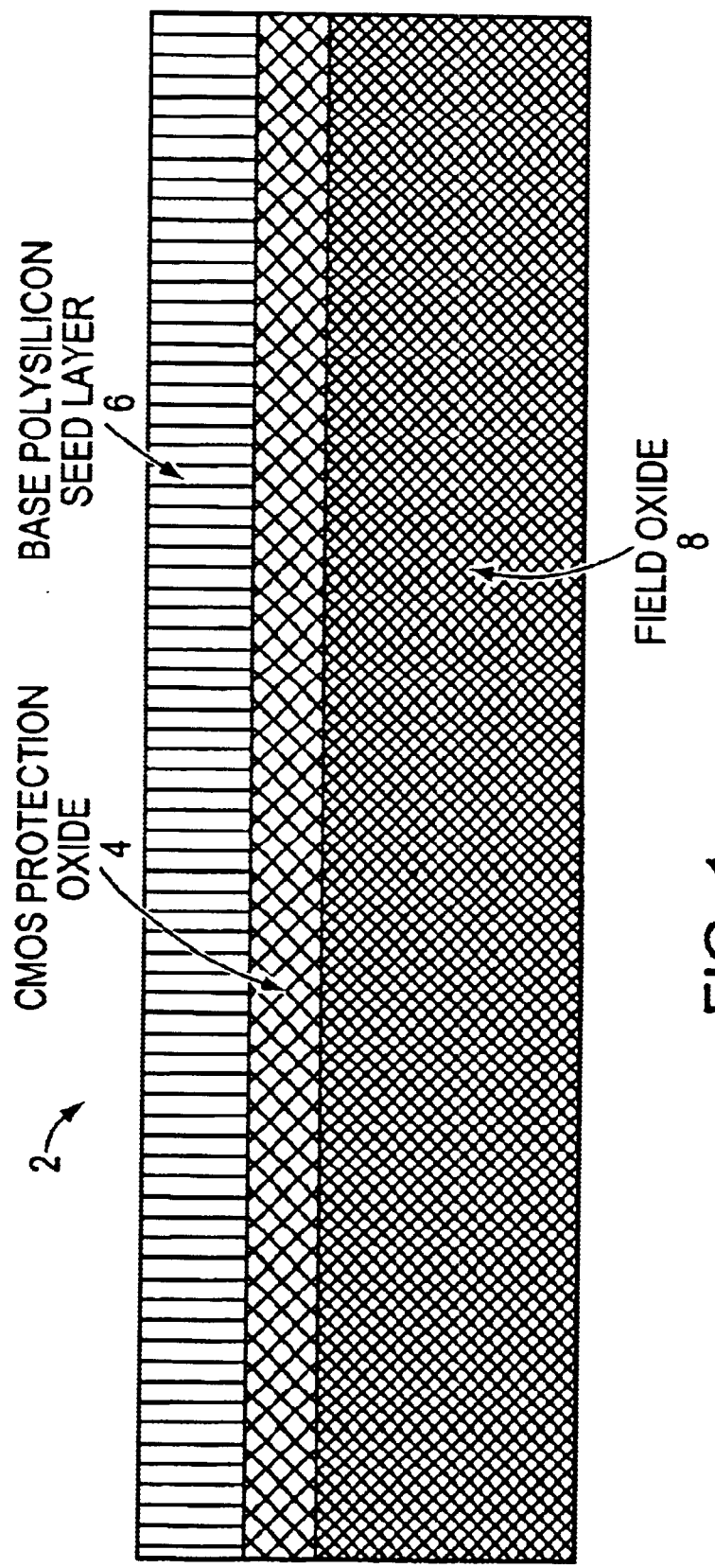
FIG. 1 is a cross section showing a region of a wafer covered with a layer stack, the top layer of which is polysilicon.

FIG. 1 shows a stack 2 from a process flow comprising an isolation field oxide 4 and a deposited polysilicon layer 6 on top of the field oxide 8. Although not the case in the FIG. 1, there may be more than one layer of oxide under the polysilicon. This polysilicon layer will be the bottom part of the final end contact structures of the high value resistors being formed, and this layer may also be used elsewhere in other structures such as for the gates of CMOS transistors or the emitters of NPN transistors. It is also possible to form this layer as part of an epi deposition.

Figure 2:
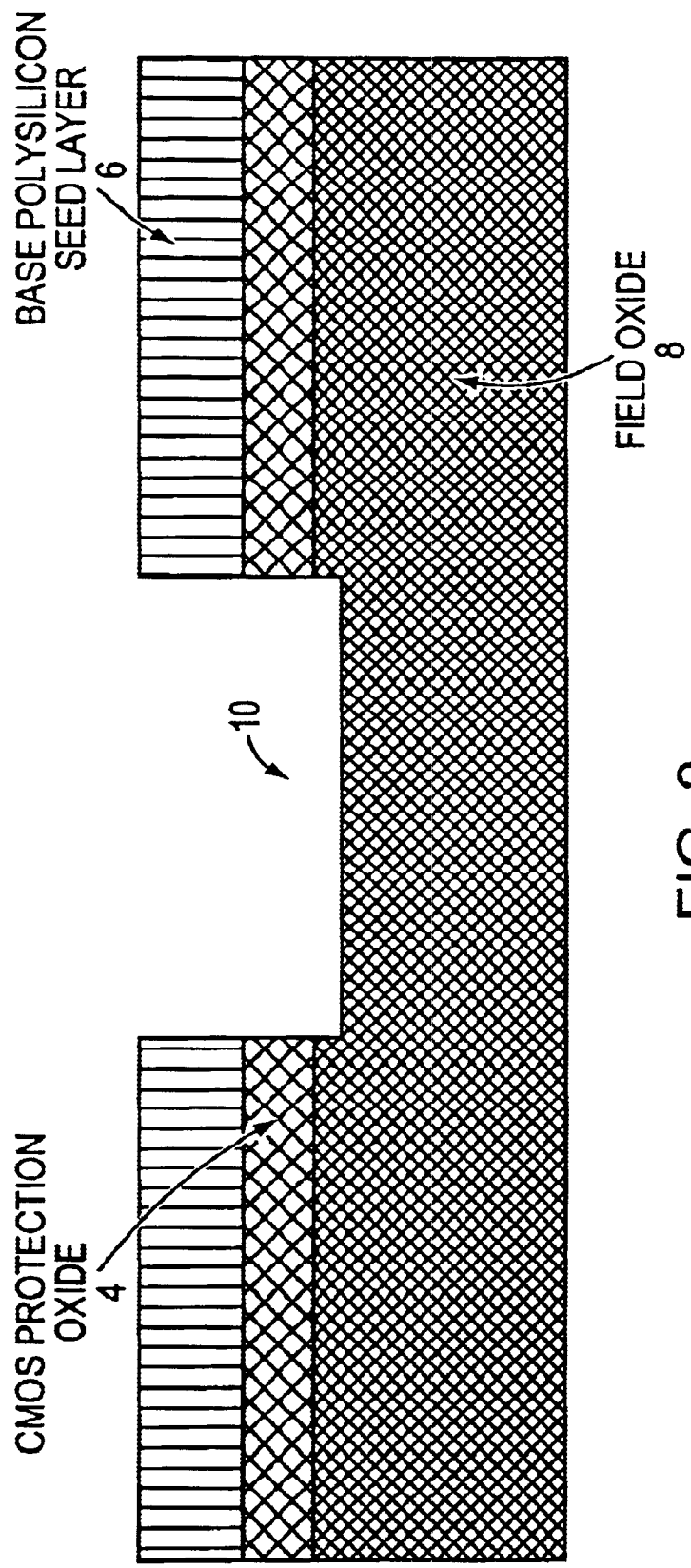
FIGS. 2 is the structure of FIG. 1 where the polysilicon is etched exposing the underlying field oxide.

FIG. 2 shows the structure of FIG. 1 etched or patterned to expose the underlying oxide layer 10. This patterning includes masking parts of the structure with photoresist, photographically exposing part of the photoresist and then etching away the unprotected polysilicon areas. Such materials and photo-processes (e.g. step and repeat, etc.) are well known in the art. It is possible that this etching process in this step is otherwise used in the process flow, or it may be dedicated to the high value resistor formation only. For example, it may be the same process sequence that will open the bipolar device active regions to allow epi growth on the single crystal base regions. In that case, no additional processing is required.

Figure 3:
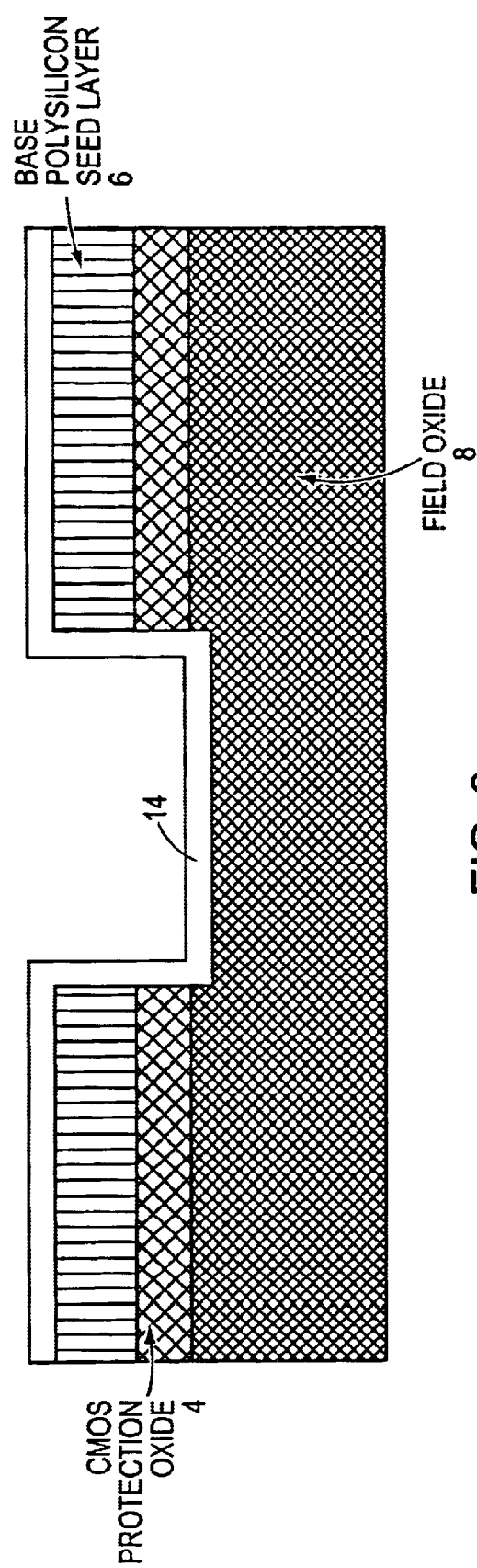
FIG. 3 is the structure from FIG. 2 with a second layer of polysilicon is deposited on the stack. This layer may or may not be doped using insitu or ion implant techniques.

FIG. 3 shows the structure of FIG. 2 after the deposition of the top polysilicon layer 14. Notice that this layer covers the horizontal and vertical surfaces of the first polysilicon layer as well as all of the exposed oxide. This second poly layer may be significantly thinner than the first layer. It may be deposited in a standard polysilicon system, or may be put down as part of an epi growth step. Germanium may or may not be used during this processing sequence. If the second layer is not insitu doped during the deposition process, this second polysilicon layer can be doped with an ion implant step. The implant may be selectively applied or may be blanketed over the entire wafer. Blanketing would require no patterning. Regardless of the doping methods, the thickness and impurity concentrations will be such that the final sheet resistance of the second polysilicon layer will be in excess of 2000 ohms per square.

Figure 4:
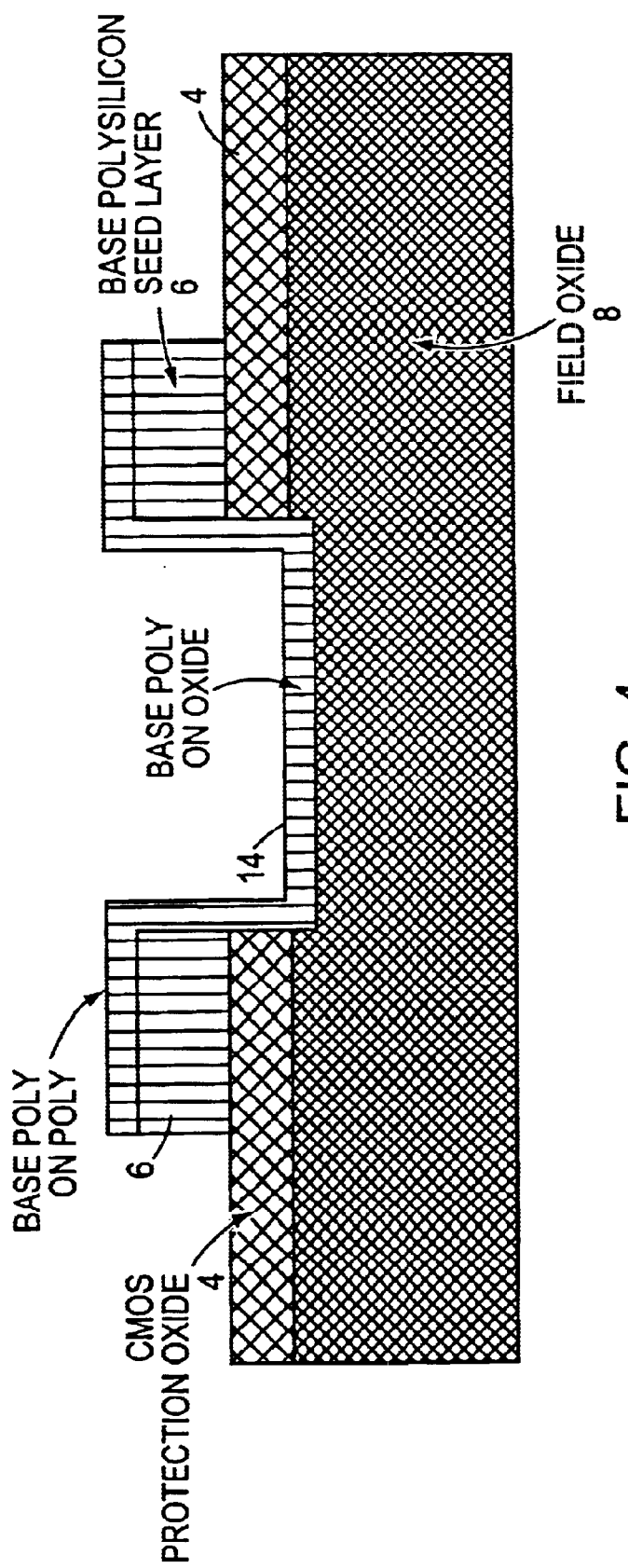
FIG. 4 shows the structure of FIG. 3 that has both layers of polysilicon etched and patterned.
Figure 5:
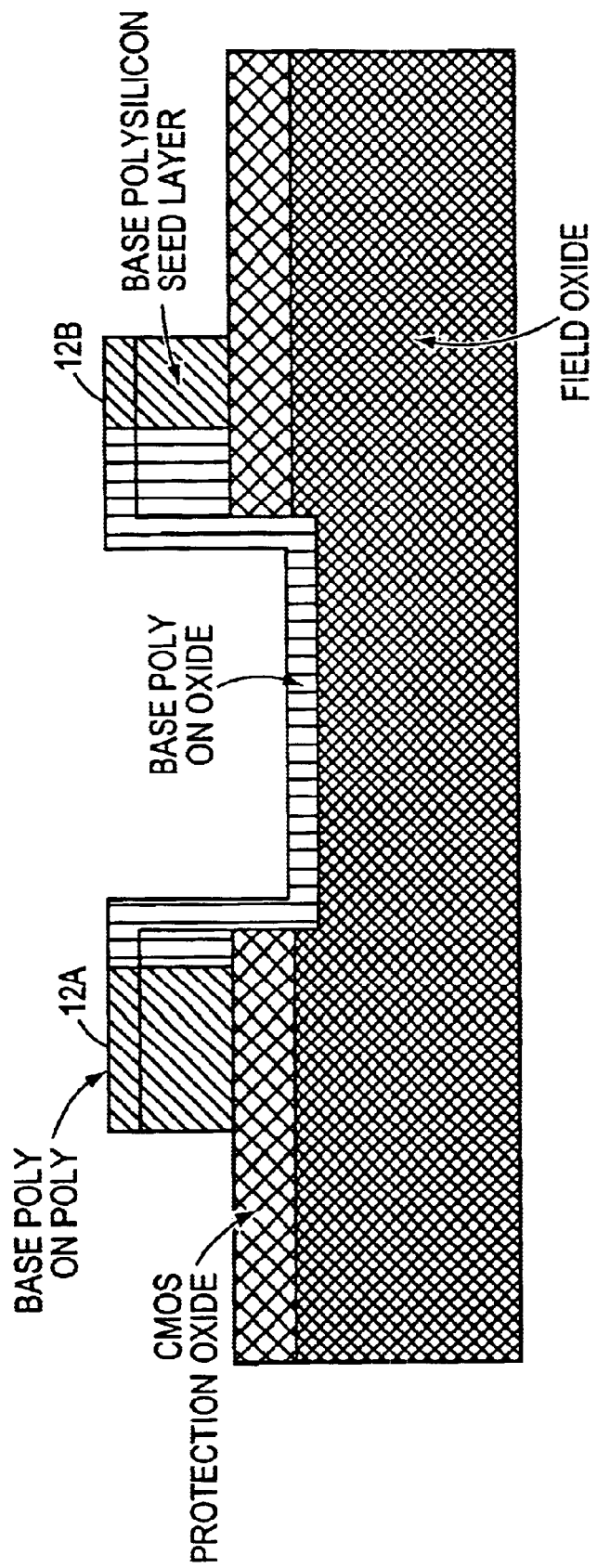
FIG. 5 is the structure of FIG. 4 with the end contacts of the resistor selectively implanted or otherwise doped.

The structure of FIG. 3 is masked and patterned as shown in FIG. 4. The polysilicon definition and etch steps used here are existing parts of the process flow even if the resistor is not used, so there is no extra complexity. The two poly resistor ends and the single poly intrinsic resistor 14 can be seen in FIG. 4. The end structures that will be the contact points for the resistor are shown in FIG. 5 after the end structures 12A and 12B have been masked and implanted with a higher dose of the same n or p type material that was used earlier in the process. This implant step may not be required, and also may be identical to existing process steps such as the CMOS source and drain implant.

Figure 6:
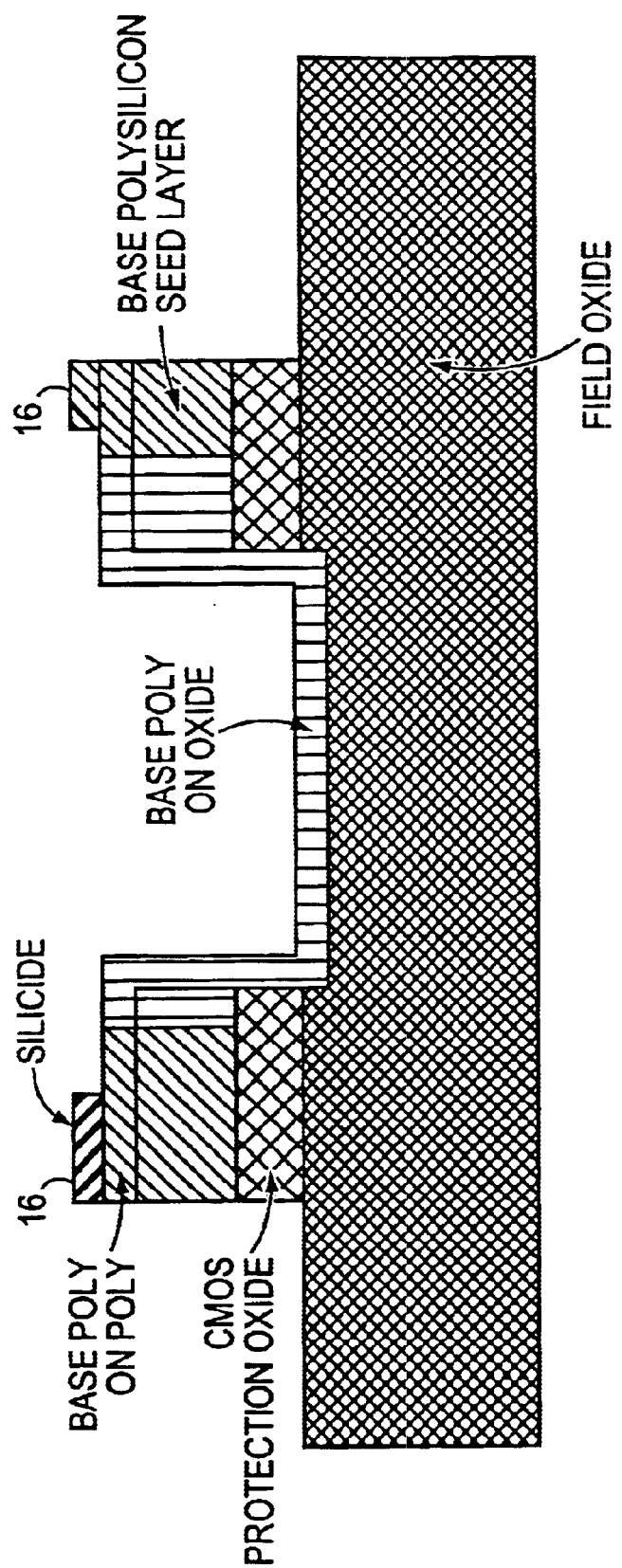
FIG. 6 is the structure of FIG. 5 where silicide layers have been formed on the dual polysilicon end structures.

FIG. 6 shows selectively patterned silicide layers 16 and 17 which may be formed on the resistor end structures. The silicide layer is optional and may overlay the entire dual polysilicon layers, or only part as shown. Importantly, if used the silicide layer is built on relatively (compared to prior art) thicker double layer of poly. This obviates the problems associated with a silicide layer directly on a thin poly layer. This silicide layer may be made using titanium, tungsten, cobalt, platinum or other metals using methods well understood by those familiar with silicon processing technology.

Figure 7:
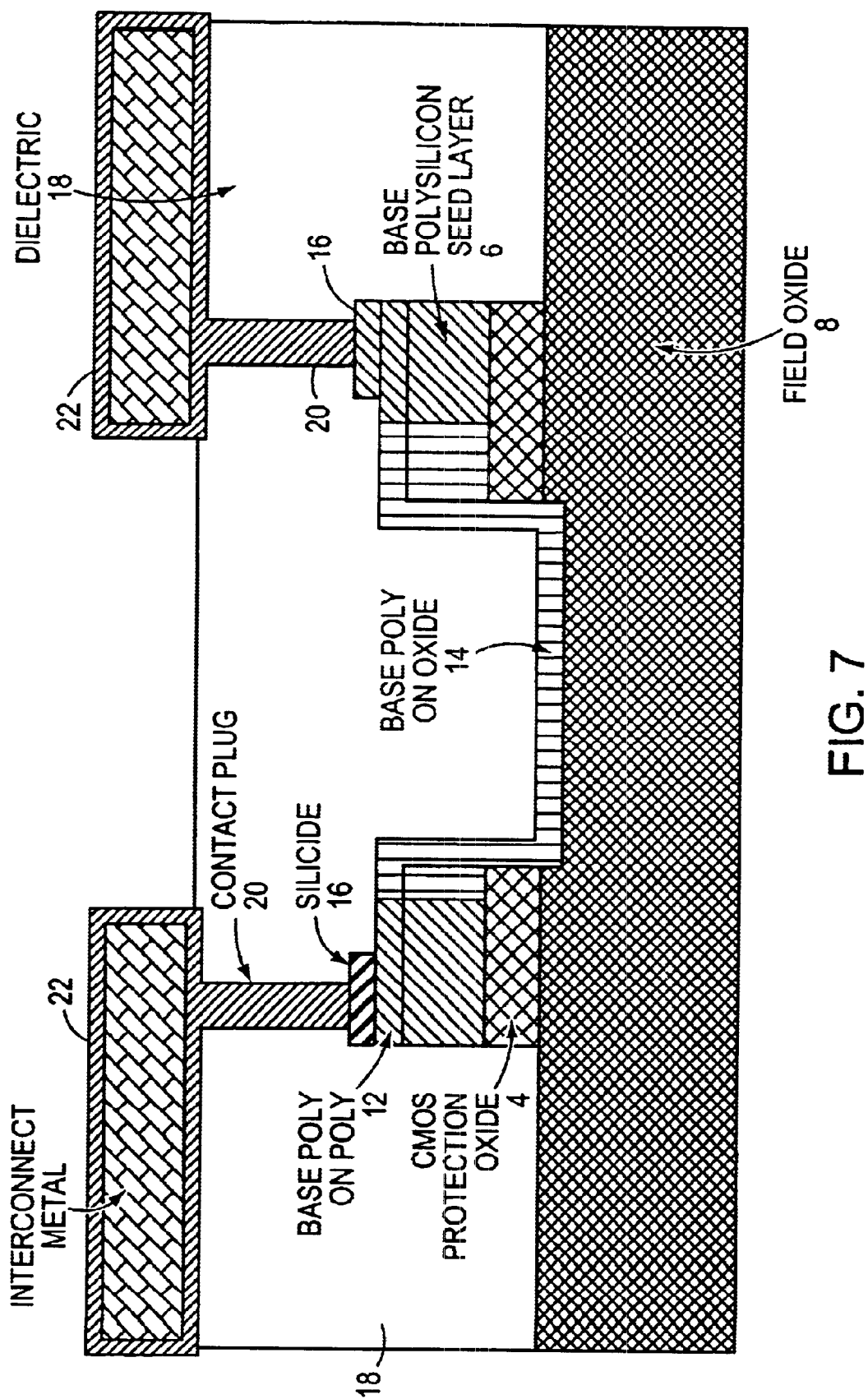
FIG. 7 is the structures of FIG. 6 where a dielectric and metal connections have been applied to form the final resistor.

FIG. 7 shows the complete resistor structures with the dielectric insulator layer 18 and the selectively placed metalized wells 20 interconnecting the resistor ends to the metalization 22 interconnecting to the rest of the chip circuitry. Note that the contacts are etched over the dual polysilicon resistor ends, rather than the single polysilicon intrinsic resistor. This allows the existing contact etch process steps to be used on this structure without modification and with sufficient process margin. The wells may be filled with tungsten, copper, aluminum or titanium or combinations thereof or other such metals as are known in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A high value polysilicon resistor formed on a semiconductor wafer, the high value resistor comprising:

at least one layer oxide layer, a first polysilicon layer fabricated on the at least one oxide layer, the first polysilicon layer having a patterned and etched opening exposing at least one oxide layer, the etched opening periphery defining a vertical edge, a second polysilicon layer deposited entirely covering the surface of the first polysilicon layer, the vertical edge, and any exposed oxide in the etched opening, the second polysilicon layer on the exposed oxide and the vertical edges patterned and etched to define the outer edges and length of the high value resistor, and the second polysilicon layer on the first polysilicon layer patterned and etched to define ends of the high value resistor a dielectric covering the high value resistor and the ends, and metal contacts reaching through the dielectric to each of the ends thereby making electrical connections to the high value resistor.

2. The high value resistor of claim 1 further comprising:

an implant into second polysilicon layer, wherein the electrical sheet resistance of the second polysilicon layer alone is in excess of 2000 ohms per square.

3. The high value resistor of claim 1 wherein the second polysilicon layer comprises a doped layer wherein the layer is insitu doped during an epi deposition process and the electrical sheet resistance of the doped second polysilicon layer is in excess of 2000 ohms per square.

4. The high value resistor of claim 1 further comprising an implant into the ends of the high value resistor to increase the impurity doping level in the ends.

5. The high value resistor of claim 1 further comprising:
a self aligned silicide layer fabricated on at least one of the ends.

6. The high value resistor of claim 5 wherein the silicide layer is composed of a material selected from the group consisting of titanium, tungsten, cobalt, platinum, or like metals well known in the art for silicide layers.

7. The high value resistor of claim 1 wherein: the metal contacts are metal plugs.

8. The high value resistor of claim 7 wherein the metal plugs are tungsten, copper, aluminum or titanium or combinations thereof.

9. A process for fabricating a high value polysilicon resistor on a semiconductor wafer, the process comprising the steps of:
forming at least one oxide layer,
fabricating a first polysilicon layer on the at least one oxide layer,
patterning and etching an opening in the first polysilicon layer exposing at least one oxide layer, the opening having a periphery defining a vertical edge,
fabricating a second polysilicon layer entirely covering the surface of the first polysilicon layer, the vertical edge, and any exposed oxide in the etched opening,
patterning and etching the second polysilicon layer on the exposed oxide and the vertical edge to define the outer edges and length of the high value resistor,
patterning and etching the second polysilicon layer on the first polysilicon layer to define ends of the high value resistor
covering the high value resistor and the ends with a dielectric, and
forming metal contacts reaching through the dielectric to each of the ends thereby making electrical connections to the high value resistor.

10. The process of claim 9 further comprising the steps of:
implanting into the second polysilicon layer, wherein the electrical sheet resistance of the second polysilicon layer alone is in excess of 2000 ohms per square.

11. The process of claim 9 further comprising the step of insitu doping of the second polysilicon layer during an epi deposition process thereby forming a doped second polysilicon layer sheet resistivity in excess of 2000 ohms per square.

12. The process of claim 9 wherein the fabricating of first polysilicon layer is part of epi base BiCMOS process, wherein the first polysilicon layerforms a protection layer for CMOS and other active or passive electrical device structures.

13. The process of claim 9 further comprising the step of an implanting into the ends of the high value resistor to increase the impurity doping level in the ends.

14. The process of claim 9 further comprising the steps of:
fabricating a self aligned silicide layer on at least one of the ends.

15. The process of claim 9 wherein the silicide layer is composed of a material selected from the group consisting of titanium, tungsten, cobalt, platinum, or like metals well known in the art for silicide layers.

16. The process of claim 9 wherein: the metal contacts are metal plugs.

17. The process of claim 7 wherein the metal plugs are tungsten, copper, aluminum or titanium or combinations thereof.

* * * * *